United States Patent
Kainuma

(10) Patent No.: US 7,504,860 B1
(45) Date of Patent: Mar. 17, 2009

(54) VOLTAGE LEVEL SHIFTING

(75) Inventor: Sean Toshio Kainuma, Johnson City, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/184,010

(22) Filed: Jul. 31, 2008

(51) Int. Cl.
 *H03K 19/0175* (2006.01)
(52) U.S. Cl. .......................................... 326/68; 326/81
(58) Field of Classification Search .................. 326/62, 326/63, 68–70, 80–83
 See application file for complete search history.

(56) References Cited

U.S. PATENT DOCUMENTS 6,043,699 A 3/2000 Shimizu 7,215,149 B1 * 5/2007 Andrews et al. ............... 326/83
2004/0104756 A1 * 6/2004 Payne .......................... 327/333
2006/0238527 A1 * 10/2006 Walker et al. ................ 345/204

* cited by examiner

*Primary Examiner*—Don P Le
(74) *Attorney, Agent, or Firm*—Cantor Colburn LLP

(57) ABSTRACT

A system comprising, a sense portion comprising a NAND logic gate that receives a first input logic signal associated with a lower voltage, wherein the sense portion outputs a sense logic signal, an intermediary portion comprising, a node operative to output an intermediary signal, a first pull down device, wherein the first pull down device receives a second input logic signal associated with the lower voltage complimentary with respect to the first input logic signal, a first pull up device that receives the sense logic signal, wherein the first pull up device is connected to a power supply at the higher operating voltage, and a second pull up device that receives the output logic signal associated with a higher voltage, an inverter portion, outputting the first output logic signal associated with the higher voltage responsive to a state of the intermediary signal.

1 Claim, 4 Drawing Sheets

FIG. 4

| State | A (VDD) | ABAR (VDD) | P1 (VDD2) | I1 (VDD2) | A2 (VDD2) | T1 (NFET) | T2 (NFET) | T3 (NFET) | T4 (NFET) | T5 (PFET) | T6 (PFET) | T7 (PFET) |
|---|---|---|---|---|---|---|---|---|---|---|---|---|
| I (Steady State) | 0 | 1 | 1 | 1 | 0 | OFF | ON | OFF | ON | OFF | ON | OFF |
| II (Transient State) | 1 | 0 | 1 | 1→0 | 0 | ON | OFF | OFF | ON | OFF | ON | OFF |
| III (Steady State) | 1 | 0 | 1 | 0 | 1 | ON | OFF | ON | OFF | OFF | OFF | ON |
| IV (Transient State) | 0 | 1 | 0 | 0→1 | 1 | OFF | ON | ON | OFF | ON | OFF | ON |

VOLTAGE LEVEL SHIFTING

BACKGROUND

This invention relates to a digital integrated circuits, and more specifically to a system for improved delay voltage level shifting.

CMOS-based (complementary metal-oxide semiconductor) integrated circuits operate at a voltage input supplied by voltage rails. Power consumption in the core logic of the integrated circuit may be minimized if low rail voltages are used. The output digital signals of the core logic typically switch between the rail voltage and ground. Sometimes the low rail voltages of the integrated circuit are insufficient to be used as output voltages for a CMOS signal that is sent from the core logic. The output voltage is increased in a level shifting input/output (IO) circuit to facilitate sending the CMOS signal. Previous level shifting IO circuits experience delays and may induce an undesirable DC current path through the circuit.

SUMMARY

The shortcomings of the prior art are overcome and additional advantages are achieved through an exemplary system comprising, a sense portion comprising a NAND logic gate that receives a first input logic signal associated with a lower voltage and an output logic signal associated with a higher voltage, wherein the sense portion outputs a sense logic signal responsive to the state of the NAND logic gate, an intermediary portion comprising, a node operative to output an intermediary signal, a first pull down device connected to the node, wherein the first pull down device receives a second input logic signal associated with the lower voltage complimentary with respect to the first input logic signal, a first pull up device that receives the sense logic signal, wherein the first pull up device is connected to a power supply at the higher operating voltage and the node, and a second pull up device that receives the output logic signal associated with a higher voltage, wherein the second pull up device is connected in parallel to the first pull up device to the power supply and the first node, an inverter portion having an input connected to the node, outputting the first output logic signal associated with the higher voltage responsive to a state of the intermediary signal.

BRIEF DESCRIPTION OF THE SEVERAL VIEWS OF THE DRAWINGS

FIG. 4 is a table illustrating states of components of the level shifting IO circuit.

DETAILED DESCRIPTION

Systems involving IO circuits are provided. Several exemplary systems are described.

Figure 1:
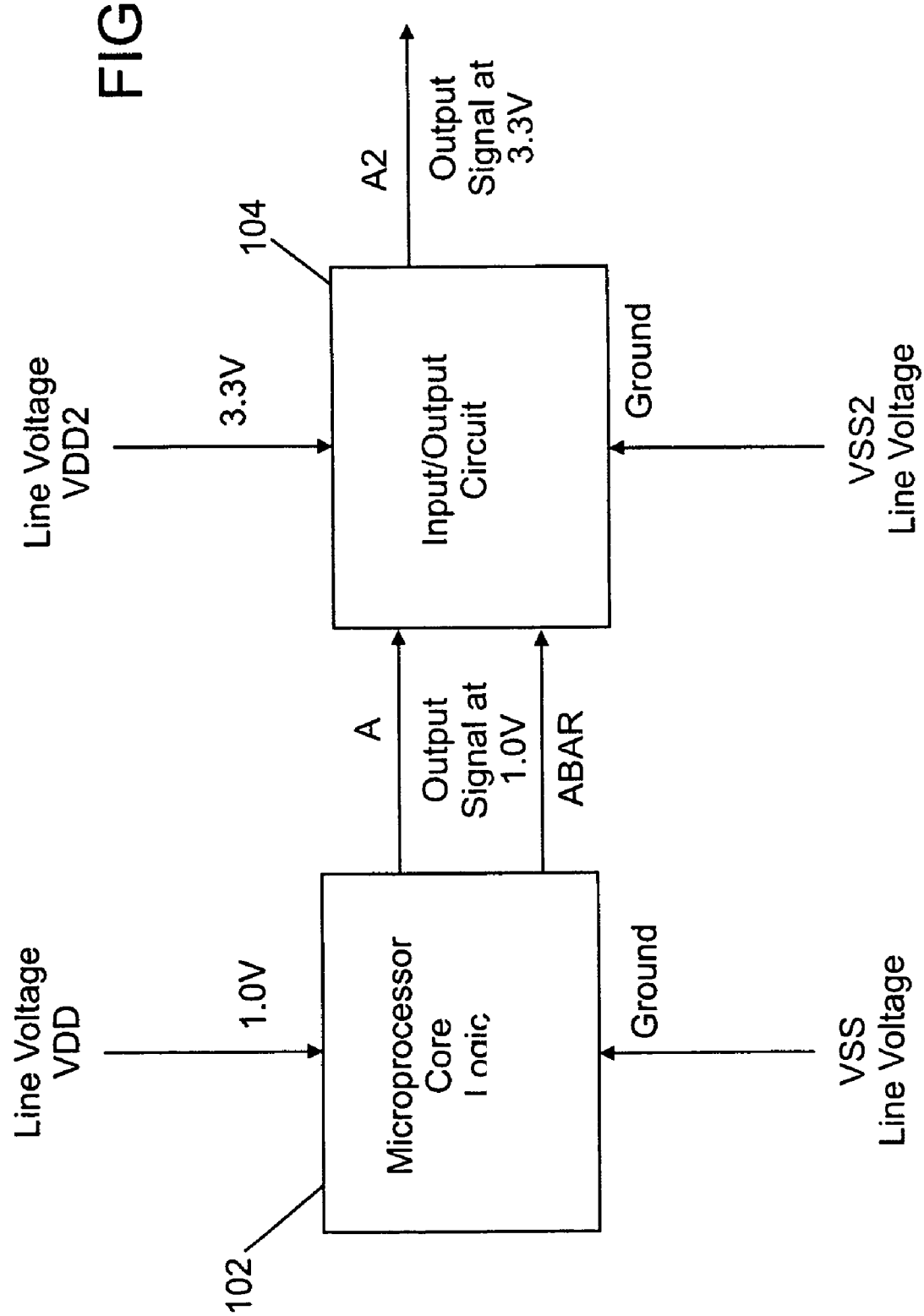
FIG. 1 illustrates a high-level block diagram of an exemplary embodiment of an integrated circuit.

FIG. 1 illustrates a high level block diagram of an exemplary level shifting input/output (IO) circuit and a microprocessor. The microprocessor core logic 102 receives a low line voltage of, for example, 1.0 volts (V). The microprocessor core logic 102 outputs the digital signals A and ABAR that may represent a digital high signal at, for example, 3.3 V and a digital low signal of approximately 0 V. The ABAR signal is the logical compliment (NOT) of the A signal. The low line voltage used by the microprocessor core logic 102 allows the microprocessor core logic 102 to conserve power, however the low voltage does not meet the needed output voltage for CMOS output.

The IO circuit 104 receives the output signals from the microprocessor core logic 102, and increases the voltage of the output signals to a high voltage. In this non-limiting example, the low voltage is 1.0 V and the high voltage is 3.3 V. By processing the output signals in the IO circuit 104, the microprocessor core logic 102 may operate at the low voltage, conserving power, and the output signals may meet the needed high voltage output for CMOS output. The IO circuit 104 also no direct current paths exist between VDD or VDD2 and VSS during steady states of the IO circuit 104. If a direct current path exists, there is an undesirable loss of power.

The operation of the IO circuit 104 may best be described while referencing the input (A and ABAR), internal (I1), and output signal (A2) states as the input signal is at steady state and as the input signal transitions from a high to a low signal.

Figure 2:
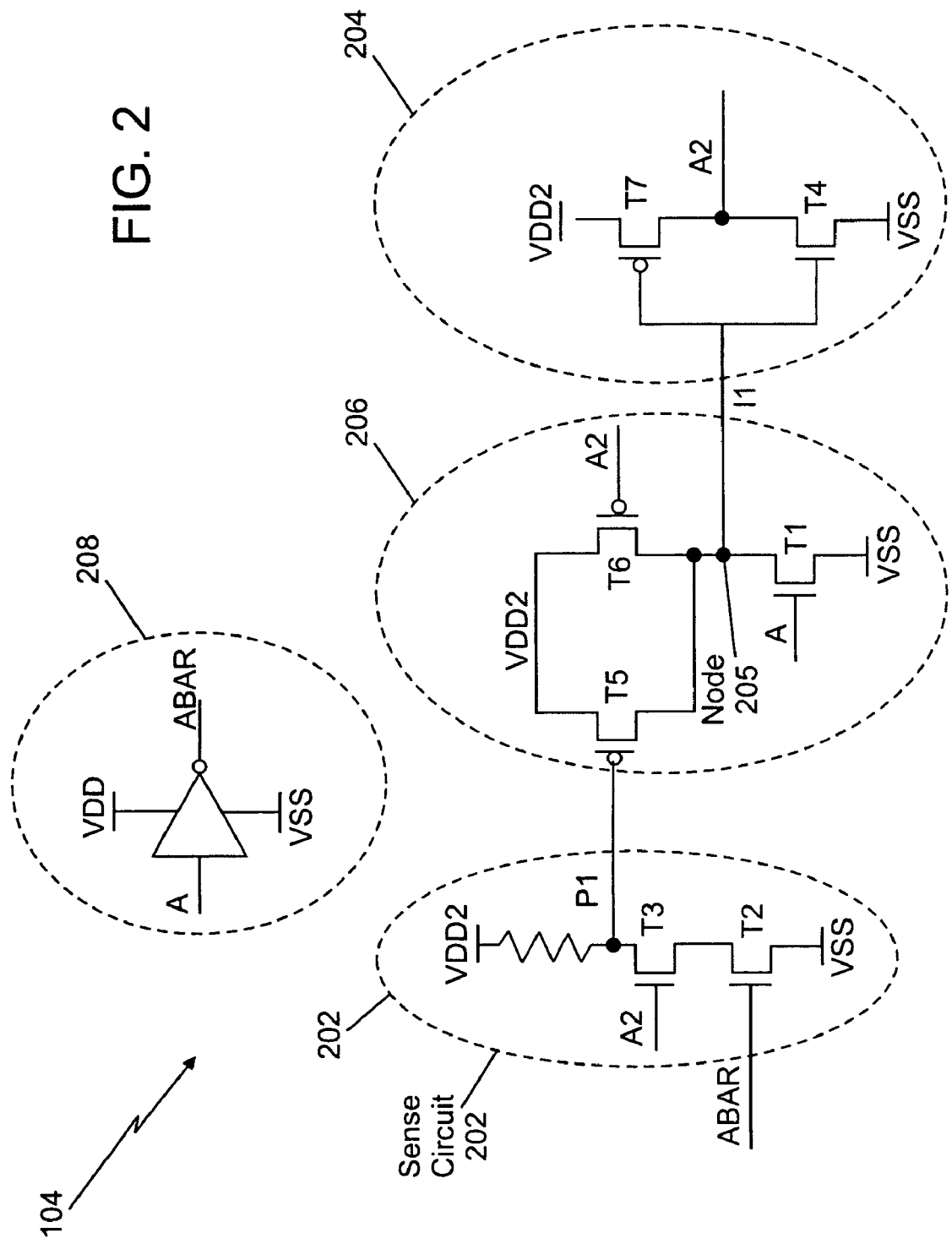
FIG. 2 is a schematic diagram of an exemplary embodiment of a level shifting IO circuit.

FIG. 2 illustrates a detailed circuit diagram of the IO circuit 104. The IO circuit 104 includes a sense circuit portion 202, an intermediary circuit portion 206, an inverter circuit portion 204, and a logic portion 208.

In operation, the input signals A and ABAR are logical compliments (NOT) in that when A is low, ABAR is high, and when A is high, ABAR is low. The input signals are input at the low voltage (VDD). The output signal A2 shares the same state (at steady state) as A, but is output at the high voltage (VDD2). Transistors are represented by the nomenclature "T#" and may be NFET or PFET type transistors as indicated in FIG. 2. Hereinafter, the transistors will be referenced as illustrated in FIG. 2.

The detailed operation of the IO circuit 104 may best be described while referencing the input signals (A and ABAR), the internal signals (P1 and I1) and the output signal (A2) states as the input signals are at steady state and as the input signals transition from a high to a low signal. The states of the signals are illustrated in FIG. 3.

Referring to FIG. 2, sense circuit portion 202 (NAND logic gate) will detect the state of the input signal (ABAR) and the output signal (A2), and change the state of the signal P1. As P1 changes, the intermediate signal I1 will actively drive from low to high or from high to low to depending on the state of the input signal. The inverter circuit portion 204 will invert the state of the output signal to match the input signal and output A2 at the high voltage.

Figure 3:
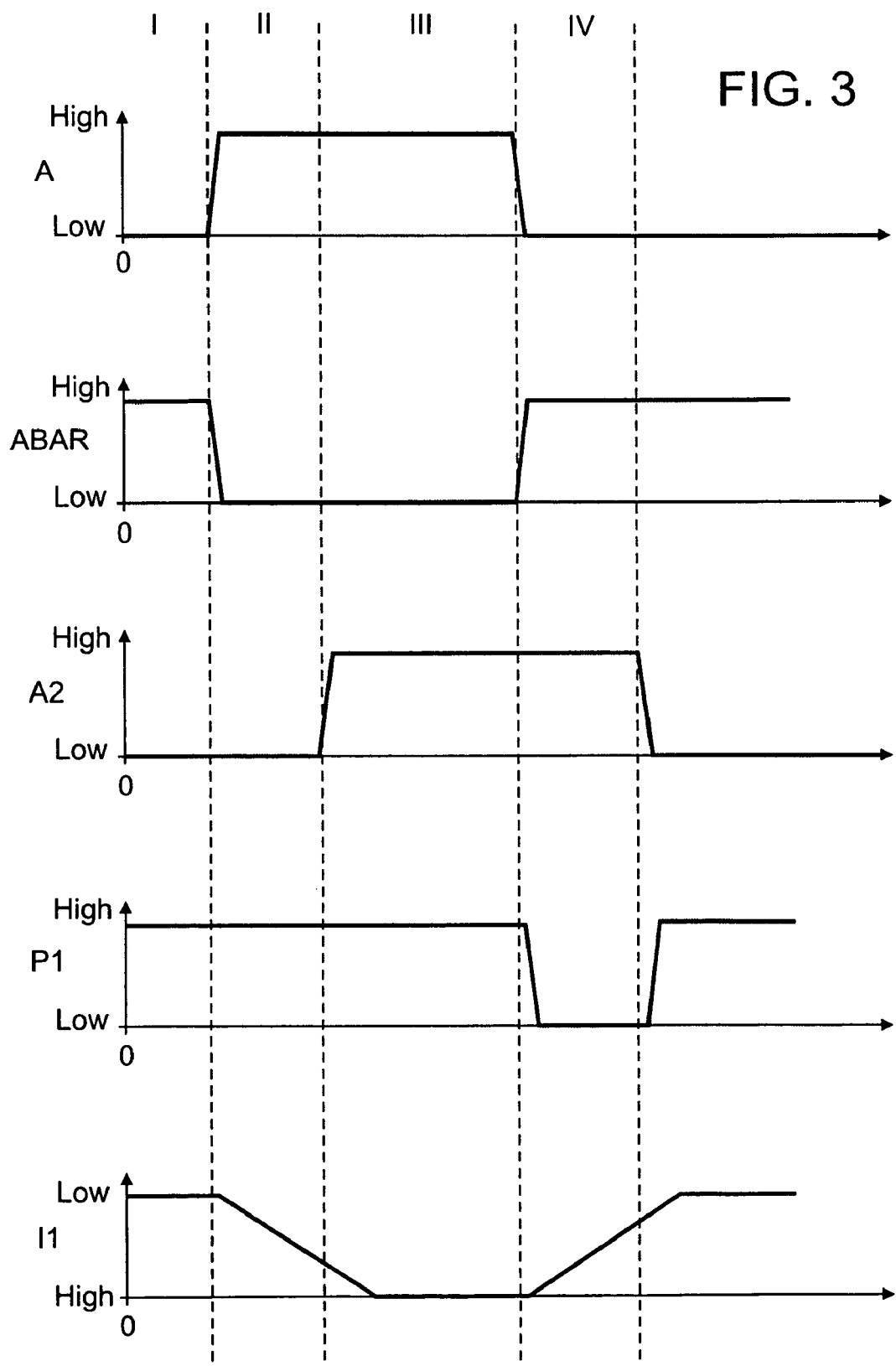
FIG. 3 illustrates high/low states of portions of the level shifting IO circuit.

Referring to FIG. 3, at time 0, the input signals A and ABAR are at a first steady state represented by the graphs in the "I" portion. A is a low signal, VSS, of approximately 0V and ABAR is a high signal VDD (the line voltage of the microprocessor core logic 102 of FIG. 1).

In steady state "I", referring to the sense circuit portion 202, ABAR is a high signal keeping T2 enabled (on). A2 is a feedback signal from the output signal A2 and is low keeping T3 disabled (off) (the status of A2 will be further described below). A resistor R1 pulls the voltage of P1 to VDD2 such that P1 is high. T3 disabled prevents any DC current path in circuit portion 202 during steady state "I".

FIG. 3 shows a first transitive state "II" where A has become a high signal and ABAR has become a low signal. A2 remains low until the completion of the transitive state "II". Referring to the sense circuit portion 202, the low ABAR signal disables T2. In the transitive state II, the signal A2 remains low keeping T3 disabled. P1 remains high.

The intermediary circuit portion 206 controls the intermediary signal (I1) and includes a node 205. The operation of the intermediary circuit portion 206 in the first steady state "I" and the first transitive state "II" will be described below.

In the first steady state "I," the P1 signal is high. Referring to the intermediary circuit portion 206, P1 is high keeping T5 disabled. T1 receives the low A signal keeping T1 disabled. The low signal A2 keeps T6 enabled driving the intermediary signal I1 high. T1 disabled, T5 disabled and T6 enabled prevents any DC current paths in circuit portion 206 during steady state "I".

In the first transitive state "II," the when A and ABAR switch states, A becomes high. The high A signal enables T1. Since T1 is a stronger transistor than T6, T1 pulls the intermediary signal (I1) low.

Referring to the inverter circuit portion 204, in the first steady state "I", I1 is high keeping T7 disabled and T4 enabled. A2 is pulled low by VSS, which feeds back to T3 and T6 as described above. T7 disabled in steady state "I" prevents any DC current paths in circuit portion 204. In the first transitive state "II," I1 becomes low. When I1 becomes low, T7 is enabled and T4 is disabled. A2 becomes high, driven by VDD2.

When A2 switches states, the sense circuit portion 202 receives the high A2 signal. The high A2 signal enables T3. The low ABAR signal disables T2. P1 remains high. A2 being high disables T6. At this point node 205 is only driven low by T1, and T5 and T6 are disabled. This concludes the first transitive state "II". The sense circuit portion 202 in FIG. 2 allows T6 to be relatively small because T6 does not have the role of actively driving I1 high. This in turn allows T1 to be smaller because driving I1 low is easier due to the decreased strength of T6.

The second steady state "III" as illustrated in FIG. 3, is similar to the first steady state "I," however the input signals (A and ABAR), the intermediary signal (I1), and the output signal (A2) have switched states. The second steady state "III" is described below.

In the second steady state "III", circuit portion 202, T2 is disabled due to a low ABAR. A2 is high, as described above from the conclusion of transitive state "II", and this enables T3. P1 is pulled high through R1 to VDD2, as T2 is disabled shutting off a path to VSS. High P1 and high A2 disables T5 and T6 of circuit portion 206. Signal A being high enables T1, causing node 205 (I1) to be low. Low I1 causes T7 to enable and T4 to disable driving A2 high. In all three circuit portions, as well as the overall circuit, no DC current paths exist in this steady state "III".

If the input signals A and ABAR invert again from low to high, a second transitive state "IV" begins as illustrated in FIG. 3. Referring to the sense circuit portion 202, ABAR becomes high enabling T2. During transient state "IV" A2 maintains the same voltage from steady state "III", high. A2 being high enables T3. VSS pulls P1 low through T2 and T3, which are enabled by ABAR and A2. Referring to the intermediary circuit portion 206, when P1 is pulled low, P1 enables T5. The low A signal disables T1. The enabled T5 allows VDD2 to drive the intermediary signal (I1) high.

Referring to the inverter circuit portion 204, In the second transitive state "IV," I1 becomes high. When I1 becomes high, T7 is disabled and T4 is enabled. VSS pulls A2 low. When the state of A2 switches to low, A2 disables T3, and R1 drives P1 high to VDD2. A2 transitioning low enables T6, actively holding node 205 (I1) high. When T6 enables and T5 disables, the second transitive state "IV" is complete, and the circuit has returned to the first steady state "I". In the first steady state "I", and the second steady state "II", no direct current paths exist between VDD or VDD2 and VSS.

FIG. 4 illustrates a reference table showing the signal states and the states of the transistors as described in above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
   a sense portion comprising a NAND logic gate that receives a first input logic signal associated with a lower voltage and an output logic signal associated with a higher voltage, wherein the sense portion outputs a sense logic signal responsive to the state of the NAND logic gate;
   an intermediary portion comprising:
      a node operative to output an intermediary signal;
      a first pull down device connected to the node, wherein the first pull down device receives a second input logic signal associated with the lower voltage complimentary with respect to the first input logic signal;
      a first pull up device that receives the sense logic signal, wherein the first pull up device is connected to a power supply at the higher operating voltage and the node; and
      a second pull up device that receives the output logic signal associated with a higher voltage, wherein the second pull up device is connected in parallel to the first pull up device to the power supply and the first node;
   an inverter portion having an input connected to the node, outputting the first output logic signal associated with the higher voltage responsive to a state of the intermediary signal.

* * * * *